United States Patent [19]

Lapeyre

[11] Patent Number: 4,549,279
[45] Date of Patent: Oct. 22, 1985

[54] SINGLE HAND, SINGLE FINGER STROKE ALPHAMERIC DATA PROCESSING KEYBOARD SYSTEM

[75] Inventor: James M. Lapeyre, New Orleans, La.

[73] Assignee: The Laitram Corporation, New Orleans, La.

[21] Appl. No.: 488,692

[22] Filed: Apr. 26, 1983

Related U.S. Application Data

[63] Continuation-in-part of Ser. No. 459,998, Jan. 21, 1983.

[51] Int. Cl.⁴ .......................... G06F 3/02; H01H 13/70
[52] U.S. Cl. .................................. 364/709; 340/365 R
[58] Field of Search ..................... 364/709; 340/365 R

[56] References Cited

U.S. PATENT DOCUMENTS

| | | | |
|---|---|---|---|
| 3,892,958 | 7/1975 | Tung | 364/709 |
| 4,029,915 | 6/1977 | Ojima | 364/709 |
| 4,042,777 | 8/1977 | Bequaert et al. | 179/79 |
| 4,065,650 | 12/1977 | Lou | 340/365 R |
| 4,124,843 | 11/1978 | Bramson et al. | 340/337 |
| 4,279,022 | 7/1981 | Abe | 364/709 |
| 4,400,593 | 8/1983 | Kunz | 340/365 R |

*Primary Examiner*—David H. Malzahn

*Attorney, Agent, or Firm*—Laurence R. Brown

[57] ABSTRACT

The bottleneck of interfacing manual keyboards with high capacity data processing systems to rapidly enter a large number data input characters and processing instructions is resolved to use fewer keys without compromise on the rapidity of data entry. Thus, data input of either characters or processing instructions is entered in response to a single manual actuation stroke of keyboard keyswitches selected either one at a time or concurrently two or more at a time by a single finger on one hand. Thus, numeric calculators can with only nine keyswitches process all ten decimal digits plus a variety of processing instructions. Full alphanumeric data input can be handled with as few as twelve keyswitches. In this mode of operation fewer keys are needed and there is no delay in entry of data. Also the invention provides a layout pattern for touch entry of data with one hand with contoured finger homing positions that sense the right keyswitches and reduce entry errors. A set of side-by-side keys in a single field arranged for selection of each entry by a single finger is provided to improve accuracy of entries by avoiding mental choices and permitting "mechanical" entry of unmemorized new data.

7 Claims, 10 Drawing Figures

SINGLE HAND, SINGLE FINGER STROKE ALPHAMERIC DATA PROCESSING KEYBOARD SYSTEM

This application is a continuation-in-part of my copening application entitled "Computer Keyboards With Few Keys Designating Hundreds of Functions" filed Jan. 21, 1983–Ser. No. 459,998.

TECHNICAL FIELD

This invention relates to multiple function high capacity data processing systems and more particularly it relates to data processing systems with manual entry keyboards providing a large choice of entries to data processing systems.

BACKGROUND ART

Modern data processing systems are developed from multifunction chips having capabilities of performing many hundreds of functions, receiving many instructions and processing a wide range of data, and in particular alphanumeric data. Manual keyboard entry techniques have not kept up with the significant increase in capacity and comprehensiveness necessary to permit the effective use of the increased chip capabilities and thus have been a significant bottleneck to the advance of the manual entry data processing art.

In many instances a keyboard with few keys located in a limited space is necessary, as in the case of pocket size computers, or those designed for "touch" entry with a single hand so that the other hand may refer to records, etc. as in the case of an accounting system. Yet the trend is to go to larger and larger keyboards to increase the capabilities of communication with modern data processing chips.

Typical art permitting a keyboard system to be used in different modes thus producing multiple use of the keys is exemplified in the referenced application, in U.S. Pat. No. 4,124,843 by H. G. Bramson et al. for "Multi-Lingual Input Keyboard and Display", Nov. 7, 1978, and in U.S. Pat. No. 3,892,958 by C. C. Tung for "Inverse/Complementary Function Prefix Key", July 1, 1975. In such cases each key can achieve several functions to communicate with a larger number of the chip functions than a single mode keyboard.

In the referenced application the keyboard capabilities are even further increased by adopting a multiple keystroke mode of operation that permits a single key to achieve multiple functions in each operating mode, depending upon whether one or more sequential strokes of the key are employed. There is, however, a price to pay for the significantly expanded range of functions available, namely, the time it takes for entry of data, and the increased chance for operator error. That is, if in order to provide alphanumeric operation a key need be stroked twice for each alphabetic character entry, it is obviously a tedious and time consuming process as compared with using a typewriter.

The problems of coordinating the multiple stroke operational mode of the foregoing application in a "touch" entry manual keyboard by an operator are significant. Also, when the number of keys become significantly larger than the number of fingers as in the foregoing patent, it is not a good environment for "touch" entry because of the frequent need to reposition the fingers and the thus significantly increased chance for operator error.

For appropriate manual entry of alphanumeric data into a touch entry system, it is highly desirable to have access to the entire alphabet plus a reasonable number of punctuation and instruction keys. A conventional typewriter keyboard generally has over forty keys in a bulky array requiring use of both hands to achieve this. These are requirements not always suitable in a data processing system and are certainly not compatible with the pocket sized systems now conventional in the art.

Feedback is most important in a touch system, namely, the ability of the operator to know that the entry is completed. This is achieved in a satisfactory manner by the movement stroke of a typewriter key. Without key movement it is most difficult to coordinate timing and to reduce manual error selections.

Also error free operation needs eliminate the operator errors induced by decision making. In the typewriting art it is well established that faster error free typing occurs when thinking is not required only copying mechanically from a text. For example, U.S. Pat. No. 4,042,777 for "One-Handed Keyboard and Its Control Means", Aug. 16, 1977 requires a thinking decision in selection of a plurality of keys constituting a chord. For sensitive data such as accounting records, etc., it is evident that operator's errors are frequently induced by decisions in choosing the "chords".

Therefore, this invention has the objective of improving the state of the art by significantly increasing the capability of a manual entry data processing keyboard to communicate with a modern data processing system in a time saving convenient manner using fewer strokes, fewer keys, and adapatable to the "touch" system of manual entry for fast data entry.

DISCLOSURE OF THE INVENTION

This invention provides a manual entry data processing system and corresponding mode of operation providing one character entry per keystroke with a capability of a very large number of data and control function entries from a few keys. The manually actuable keyboard has a few keys operable in a "touch" mode with a single hand with substantially error free. Thus, for example, twelve keys can afford full alphanumeric communication with a data processing system including a plurality of control functions for directing the functional operation of the data system. With sixteen or seventeen keys, literally hundreds of functional operations may be selected to produce effective use of the multiple capabilities of modern computer chips.

The manual touch mode with a minimal number of keys is achieved by adapting a data processing input system into a mode responsive to the entry of one or more concurrently operated keyswitches for each successive manual entry signal. Thus, a keyboard provides for side-by-side manually movable keys arranged for selection by a single finger stroke either individually or concurrently with two or more keys in unison. In this manner the number of unique combinational selections per keyboard key is significantly increased to permit many functions with few keys.

A graphic keyboard pattern of indicia representative of the key member layout and requisite manual selection of key members for specific data entries and control functions thus designates for example separate indicia for operation of one key at its center, two side-by-side keys at a line intersection between key rows and columns, and three or four adjacent keys at a cross line intersection of columns and rows of keys. For example, a 12 key keyboard will produce in this mode 47 unique signals, and thereby serve as comprehensively as a 47 key type writer keyboard.

Further to aid in the "touch" selection of the data entries the keyboard layout is contoured to produce different "touch feel" for the different single or combinational key selections of a finger stroke. Also in this respect the timing of data is controlled by a movable key entry requirement so that the operator can rest his fingers on a key spot touch wise without entry of data, and so that he can accurately time and sequence the entry of data as in typing. This is significantly important in reducing operator induced entry errors in data processing, and in significantly increasing the speed of data entry from a manual keyboard having far fewer keys than a typewriter.

A set of keys is arranged in a single field of side-by-side keys operable in general by a single hand in a mechanical mode without mental decision making after the keyboard is learned. Feedback feel signals are available in both movable manual keyswitch stroke form and in key contour structure identifying different finger locations. One key feature of the invention is that a single finger strokes a live keyboard for entry of each character by a single stroke. Thus a twelve key field can produce a complete set of alphanumeric characters operable by one hand using a single finger at a time for an entry stroke.

THE PREFERRED EMBODIMENTS

Figure 1:
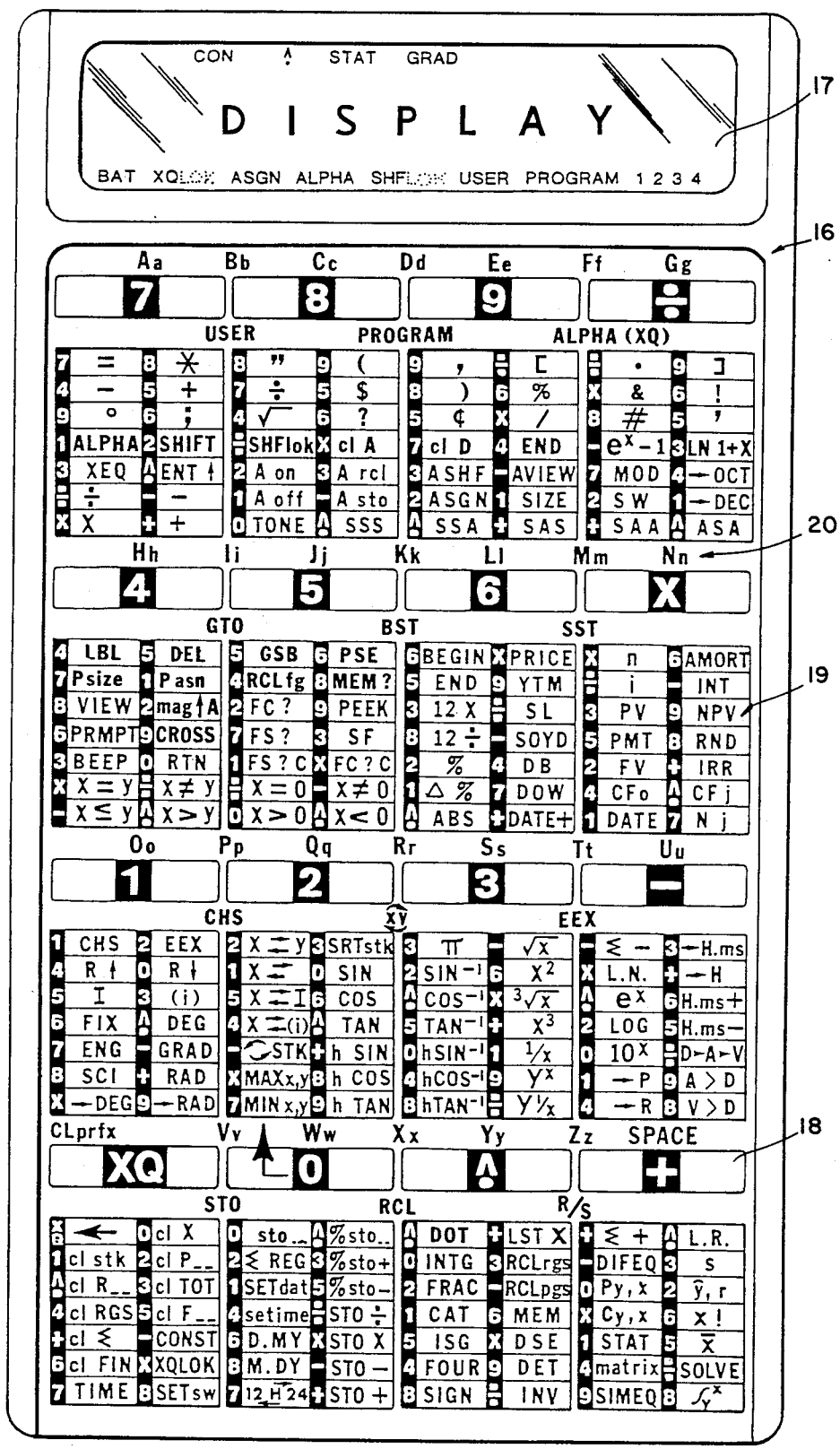
FIG. 1 is a plan view of a multiple-function multi-operating mode manual entry data processing system embodying the invention by providing full selection of any letter of the alphabet by single manual keystroke with a sixteen key keyboard.

Representative of a manual entry data processing system capable of communicating efficiently with a high capacity chip to use numerous of its functional capabilities is the system represented by the keyboard 16 and display panel 17 of FIG. 1. This system is described in detail in the referenced patent application. Thus, a set of keys 18, in this embodiment sixteen, provides a direct entry set of numeric decimal digits and selected most often used data processing functions. A charted set of indicia 19, preferably located adjacent the key that is first chosen identifies a large number of added functional or data selections provided by a two stroke entry cycle. That is a first key above each chart is selected then the second key designated in the chart will complete selection of the function, etc. designated on the chart for entry into or instruction to the data system.

As afforded by this invention the capacity of the sixteen keys to enter data with a single keystroke is expanded enough to accommodate selection of the entire alphabet plus two control functions. Therefore, sixteen keys provide twenty-eight direct single keystroke entries. The alpha designation 20 for this set is superimposed above the keystroke finger rest position across each row of keys.

Figures 2, 3:
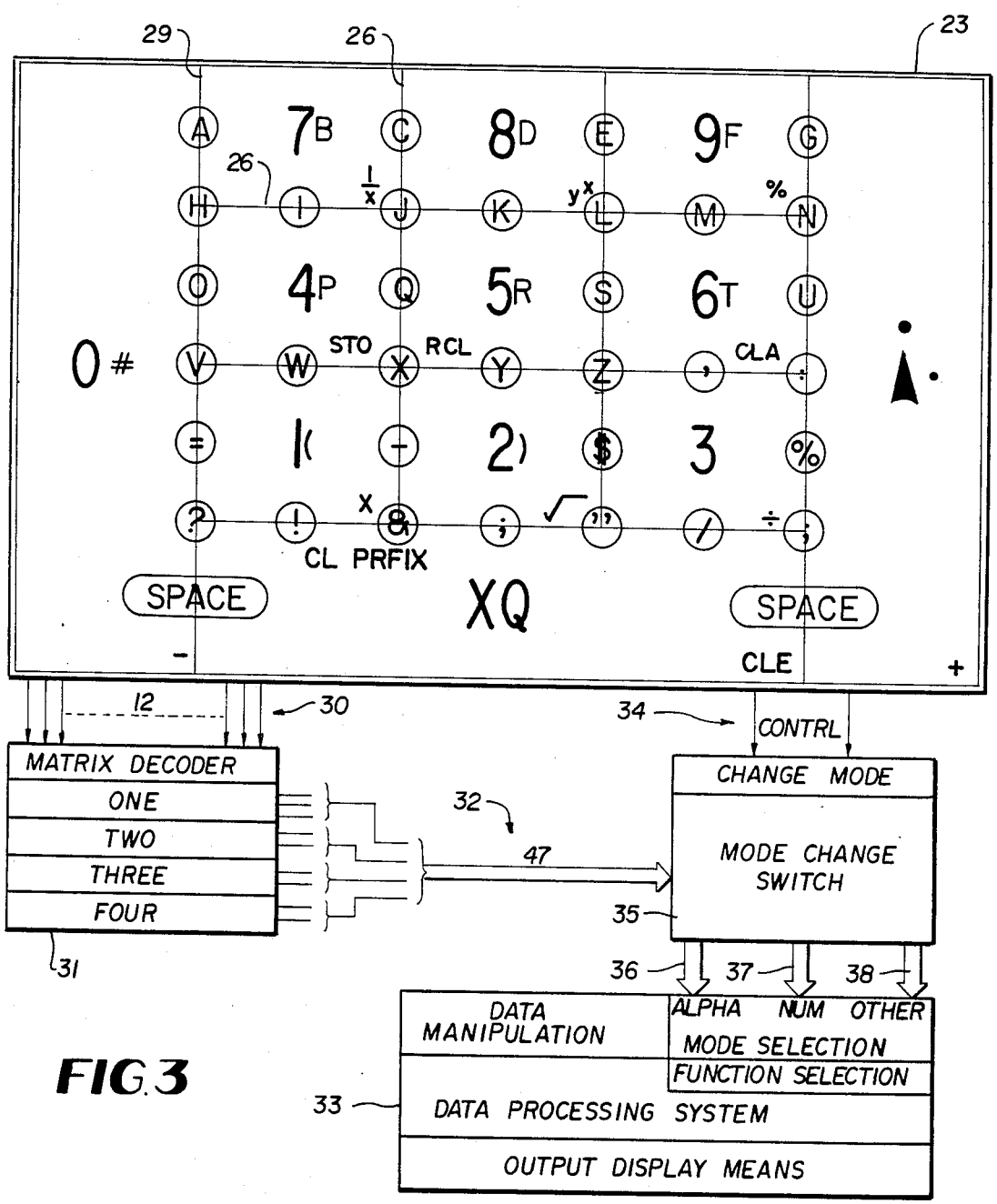
FIG. 2 is a partial section view through the movable keys on the FIG. 1 keyboard showing the keyboard contour for identifying for touch manual control additional signal entry positions at the joint between two side-by-side keys, whereby two keys can be concurrently actuated by a single finger stroke.
FIG. 3 is a diagrammatic block diagram view of a data processing system embodying the invention with a twelve key manual entry keyboard permitting direct entry of 47 signals permitting full alphanumeric capability with a single manual keystroke per signal entry.

As seen better from FIG. 2, the keys 18 may be actuated either singly by a finger stroke directly in the center position on the key 21 or two in unison by a finger stroke at the adjacent side-by-side edges of two keys having a contoured finger guide hollow 22 for assuring error free actuation of two keys concurrently. It is recognized therefore that this invention by providing for concurrent actuation of a plurality of keyswitches by a single finger stroke bridging side-by-side keys and corresponding processing of the keystroke signals has further significantly extended the capacity and versatility of data processing systems and has further resolved the keyboard bottleneck by permitting more of the data system capability to be used with manual entry keyboards.

A special side-by-side pattern of keyswitches, such as shown on the keyboard 23 of FIG. 3, even more efficiently uses the principle of actuating one or more key switches with a single finger selected keystroke. Note that the side-by-side keys are spaced as closely together as feasible without interference with adjacent keys, in order to provide positive error free finger stroke actuation of the movable keyswitches. Thus, either a conventional single key is selected or a plurality of two, three or four keys at the various side-by-side key positions along the spacing lines between keys at the various rows, columns and intersections of rows and columns.

Therefore, the alphabetic letter A is selected by simultaneous operation of the 0 and 7 keyswitches along the column 24. B is selected by the single keyswitch 7. H is selected by simultaneous operation of three keyswitches 0, 7 and 4 at the intersection of column 24 and row 25. J is selected by concurrent movement of keyswitches 4, 5, 7 and 8 at the intersection of row 25 and column 26, etc. The combinational keyboard selection of of different combinations of concurrently actuated switches in a capacitive action keyboard with spaces between metal oxide vapour deposit keys used for peripheral keys at intersections of rows and columns of key positions is set forth in German publication No. 2924515, Jan. 1, 1981. However, such keyboards cannot be used with the present invention because of many functional deficiencies, including: the wide spacing between keys, the lack of ability to segregate independently the various combinations by the touch method, the lack of feedback to know when and the timing of the actuation, the general criticality of the capacitive action in generating error signals of various types, and the lack of mechanical movement which equates the keyboard to familiar touch methods thus reducing learning time and error probabilities, and permitting the fingers to find a home resting spot on the keyboard from which the touch system can enable the operator to use the keyboard without "hunting and pecking" or reference to chart, table or key indica.

An important feature of this invention is that all the keyswitches are positioned in a single field of side-by-side keyswitches taking up a minimum amount of space and therefore being fully compatible with pocket size computer systems. Even more important this produces an optimum maximized data processing capability for one hand entry.

As seen from FIG. 1, and as described in the referenced application, it is a most important function in a manual entry keyboard for a data processing system providing many key selection choices that an operator can have displayed on or adjacent the keys a graphic display of the various manually selectable choices available in operation of the keyboard. Thus, although some prior art techniques are known regarding efficient use of a few keys to communicate manually with a data processing system, none can at the same time give a substantially complete set of instructions for a large number of the key selections. For example, consider the one-handed keyboard of U.S. Pat. No. 4,042,777—F. C. Bequaert et al., Aug. 16, 1977, wherein separate thumb and finger field keyboards are discussed. A complex chord system using a multiple simultaneous combination of fingers to select keys is set forth. This for new unmemorized entry of data leads to input errors due to mental decision operator choices. Also, there is a convenient way to simply graphically display the choices afforded, so that infrequently used functions or combinations can be checked out visually for accurate entry without reference to an external manual or catalog.

The system of Bequaert et al., however, has merit as an element in achieving the principles of the present invention, provided it is segregated from its environment and afforded in different and improved form in manual entry keyboard systems providing a restricted number of live key combinations operable solely by use of a single finger for data entry, as will be made more apparent in the following description.

Keyboards 23, and the like, may be coded in many ways to provide compatible manual input interface with modern data processing systems. Should each keyswitch have an independent lead, a set of thirteen wires comprising a common lead and twelve key identification leads would be provided. Alternatively, as later shown herein, keyboard matrix wiring patterns may be provided to reduce the number of wires that need be handled. In any event, this twelve keyswitch keyboard 23 with single keys operated one at a time produces twelve independent output signals responsive to keyswitch closures as indicated at cable 30.

It is well known in the art how to segregate different combinations of switch closures in a decoder arrangement, generally a matrix, as indicated in block 31. If all combinations of only one, two concurrent, three concurrent, and four concurrent keyswitch closings from a twelve key keyboard are decoded, the number of unique combinations is forty-seven as indicated at cable 32. These forty-seven individual signals are thus segregated into individual transmission channels available for entering data and functional instructions to the data processing system 33. Thus, this invention provides from twelve keys operable by a single hand and taking up little space a keyboard with the full communication capabilities of a full (two handed) typewriter keyboard. It is most important in this respect to note the critical timing. Each of the forty-seven signals takes a single keystroke time. To get such signal capacity in the system of the referenced copending application a sequence of two keystrokes per entry is required. In most prior systems a much larger number of keys is required. Clearly it is advantageous in terms of the number of switches and wires used to reduce the number of keyboard keys. Also, many applications limit available keyboard space, such as in pocket sized systems. Furthermore, some applications are highly advantageous for single handed touch entry of a large number of entries such as encountered in alphameric data processing systems. Routinely accountants, for example, use only one hand for data entry while using the other to handle records, ledgers and the like.

Clearly the keyboard switch layout and data selection is optional. In the present keyboard 23 layout, for example, the numbers may be accessed by a shift operation, rather than by direct access, in order to provide further punctuation symbols, etc. The shift operation, function selections, and change of modes are achieved by control keys XQ for execute and the decimal point key which operates in dual capacity as a data entry key when stroked twice in succession. The clear and spacing functions are also provided on the graphic keyboard pattern of indicia laying out the requisite manual selection of the data entry and control functions selectable in the data processing system 33.

The control key functions for changing the mode, such as from alphameric to numeric, may be part of the set of forty-seven signals 32, but for illustration purposes are identified at 34 for operation through the mode change block 35. The data processing system 33 is internally programmed to enter and process data in different modes in response to keyboard data entry and control functions. Leads 36, 37, 38 illustrate the features of the FIG. 1 embodiment and the prior referenced patent, where the entire keyboard operates live in a single stroke entry pattern in a plurality of selected modes, thereby increasing keyboard flexibility to use the built-in capabilities of the data processing system 33. Illustrated are alpha(meric) and numeric modes to correspond to the keyboard number and alphabetic indicia, and other modes that may be selected by the keyboard 23 from state of the art capabilities in the data processing system 33. Thus, a new data processing interface technique is provided for manual data entry to increase keyboard communication ability and to interface to manual input needs of a touch system entry and fuller employment of the data system capabilities.

Figure 4:
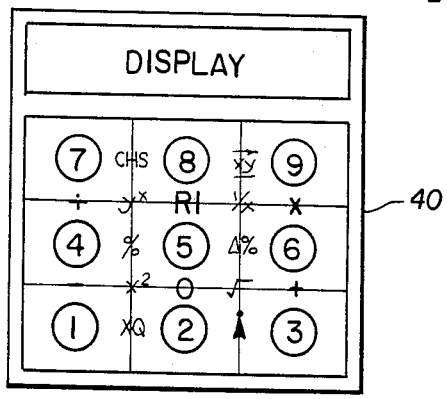
FIGS. 4 and 5 are further diagrammatic keyboard layout patterns of 9 and 16 key keyboard embodiments afforded by this invention.

As seen from the calculator 40 in FIG. 4, a nine key keyboard is now feasible for numeric calculators operable in the single finger stroke manual entry mode. In this embodiment, twenty-three entries are provided for a significant range of function keys in addition to the ten decimal digits, all possible in a single field of nine keys.

Figure 5:
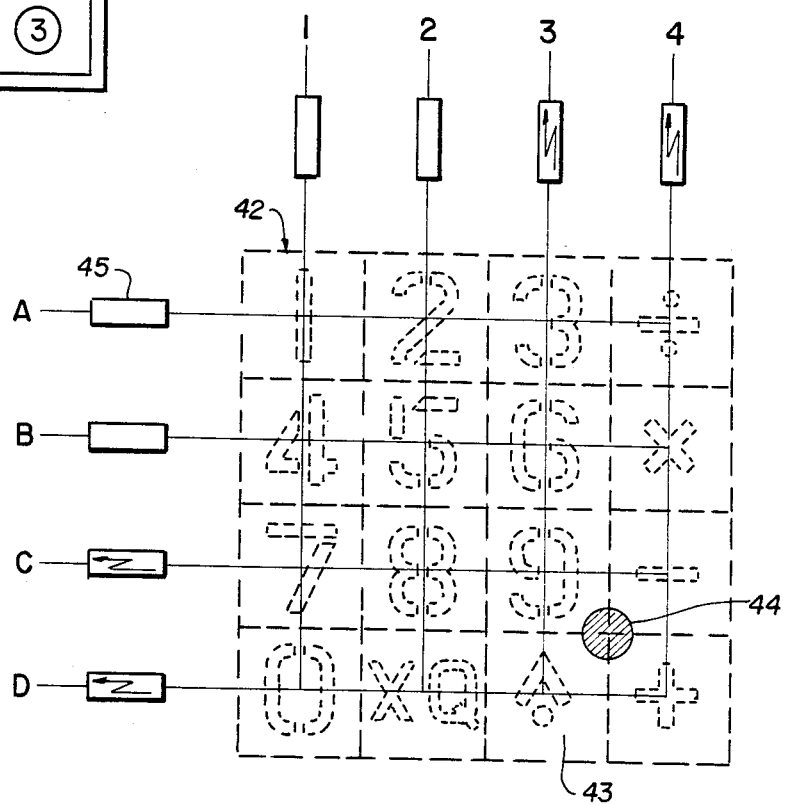

The diagrammatic layout of FIG. 5 provides for a sixteen key keyboard 42 where the single actuation keys provide for ten decimal digits and six function selections. As in other embodiments herein displayed, one key is saved by using the decimal point key 43 as a dual function key. Since only one decimal point ever appears in a numeric entry, the second stroke of the decimal point key 43 during the word, terminates it and enters the word into the calculator register, thus saving a separate "enter" key.

Note that this keyboard has matrix wired key columns 1, 2, 3 and 4 and rows A, B, C, D. Thus, each single key is identified by a column row intersection, i.e., 5 is at B2. In accordance with this invention, however, where simultaneous keys may be actuated by a single finger stroke, the keystroke position 44 illustrated in circular hatching, at the four corner intersection of a row and column spacing between keys will actuate four keys as designated by C, D, 3, 4, or C3+C4+D3+D4 which is shown by arrow designation in the corresponding blocks 45.

Figure 6A:
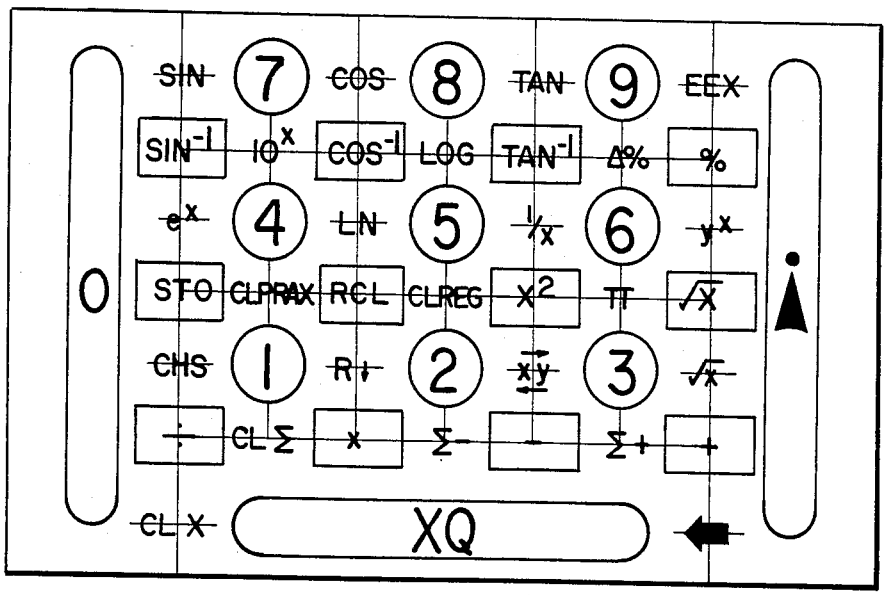
FIGS. 6, 6A and 7 to 9 are further keyboard layout patterns of 12, 16, 17 and typewriter formal key embodiments respectively, employing a contoured touch pattern enabling an operator to feel the difference between different finger rest positions corresponding to key combinations used in selecting different signal entries.
Figure 6:
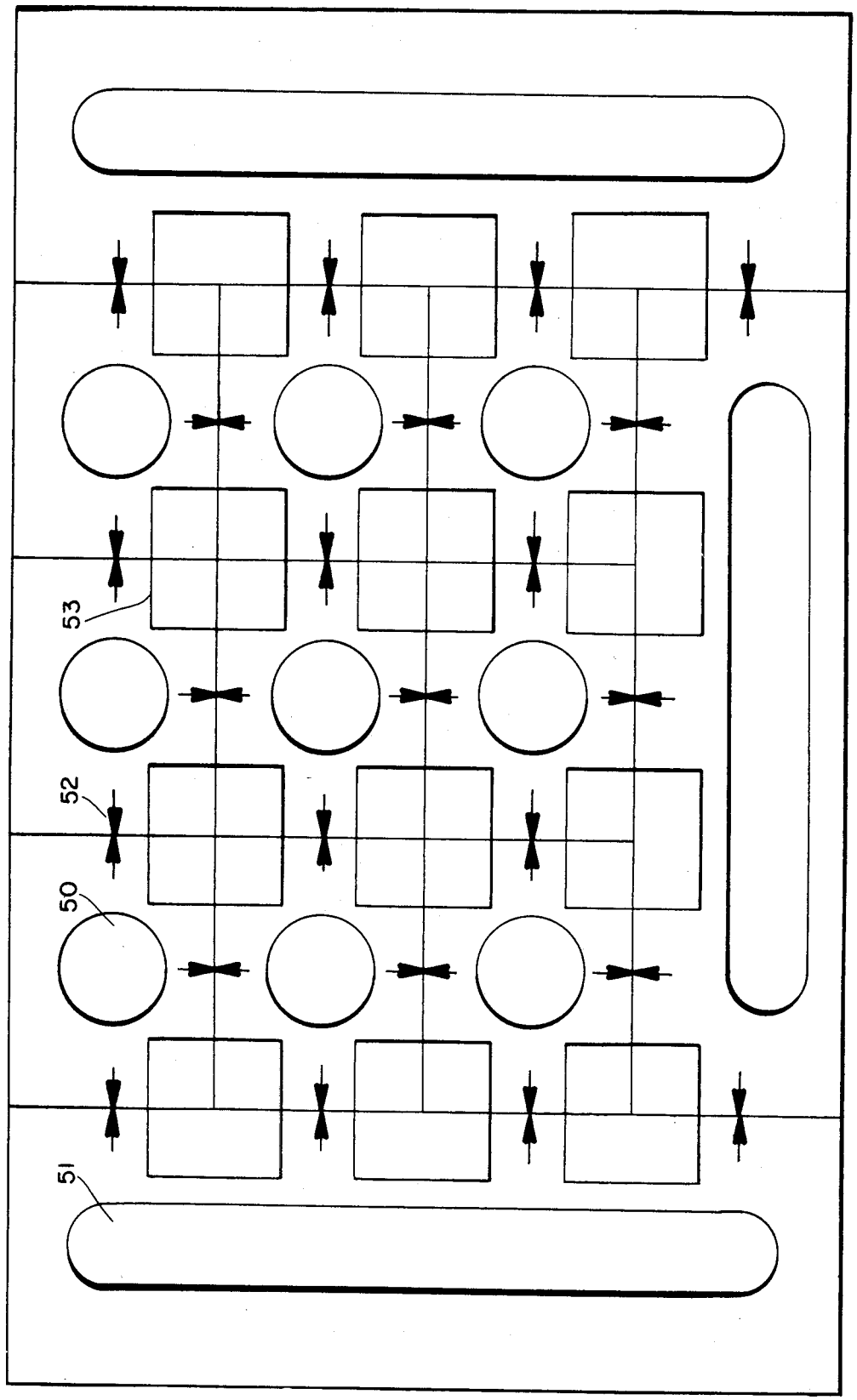

As hereinbefore shown in FIG. 2 and as now related to the twelve key pattern of FIG. 6, a keyboard contour pattern is provided for "touch" operation. Thus, circular 50 or oblong 51 depressions are indented in the keys for a finger rest "home" position for single key actuation. Two simultaneous keys are actuated at adjacent separation lines between two keys as identified by the back-to-back arrowhead notation 52. A raised contour at the three and four corner intersections where keys meet is provided at regions 53. Thus the touch system produces a definite feel for homing and roaming positions of the fingers on a single hand for direct entry of the various combinations available. Clearly this reduces error potential of manual entries.

Typically, the simple layout of FIG. 6A provides single finger strokes with no shifting for a rather comprehensive set of computer functions in a numerical mode computer. Other layouts are, of course, feasible, and mode change to provide two or more sets of graphic keyboard indicia patterns, which may be color coded or otherwise differentiated.

Figure 7:
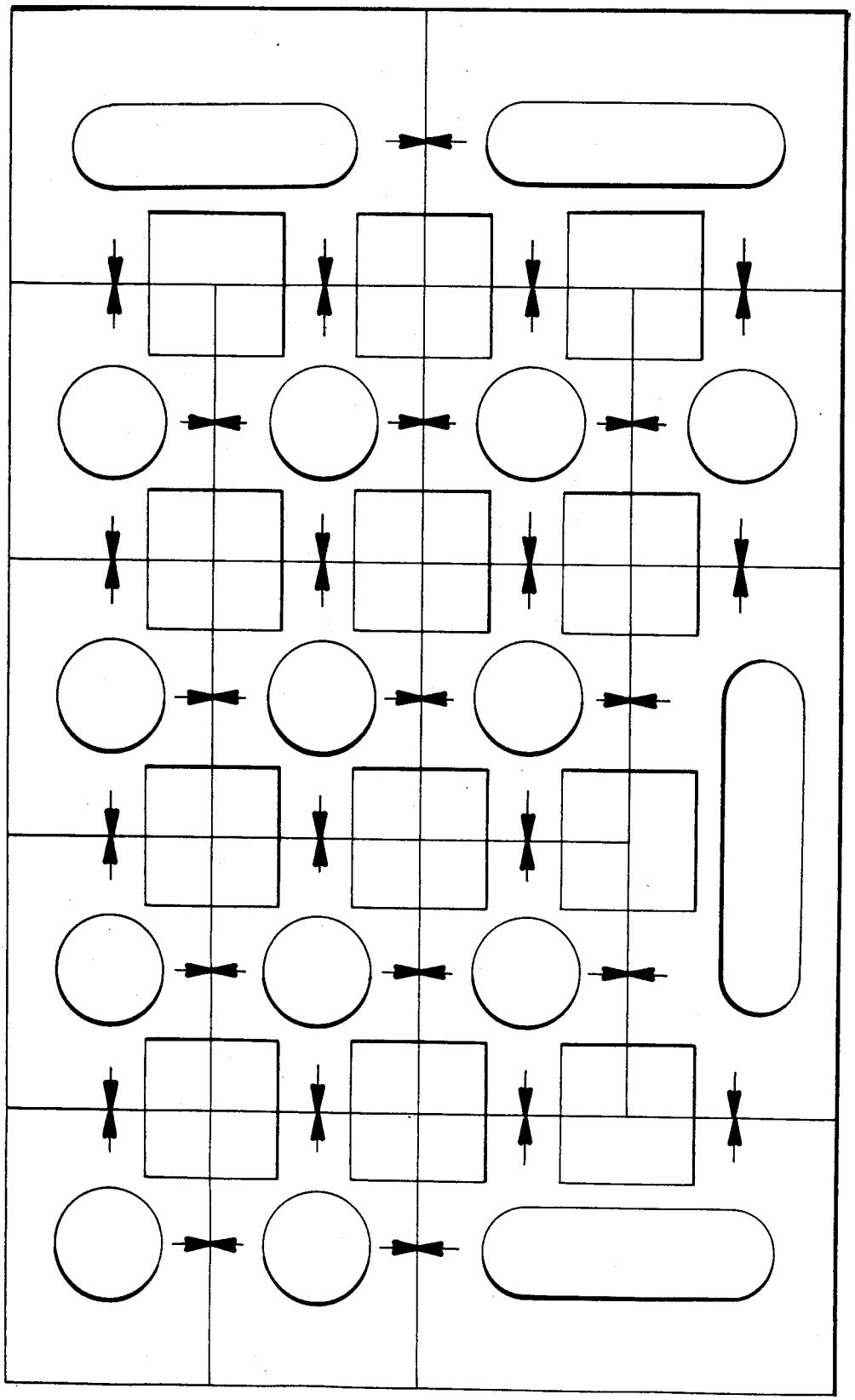
Figure 8:
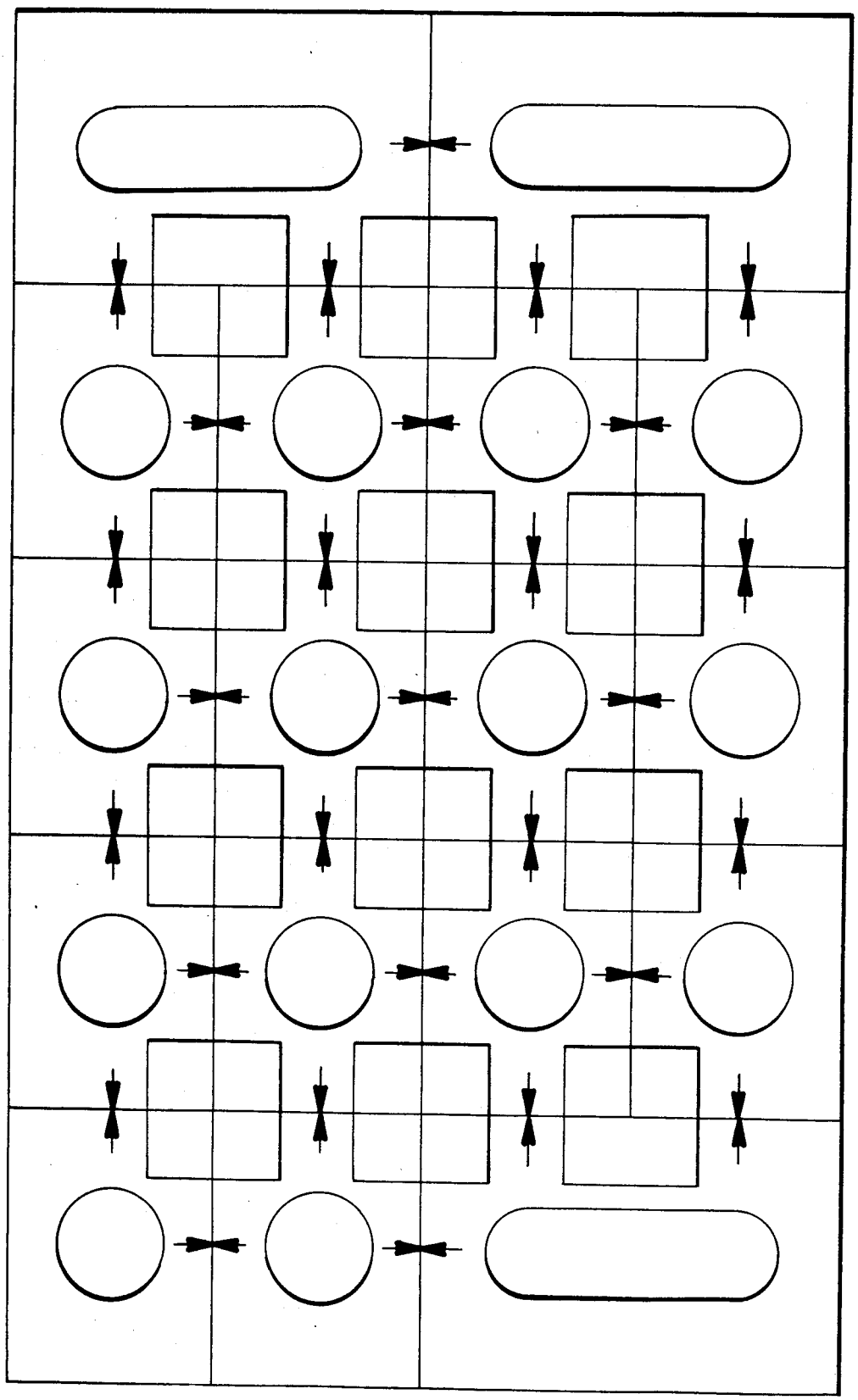
Figure 9:
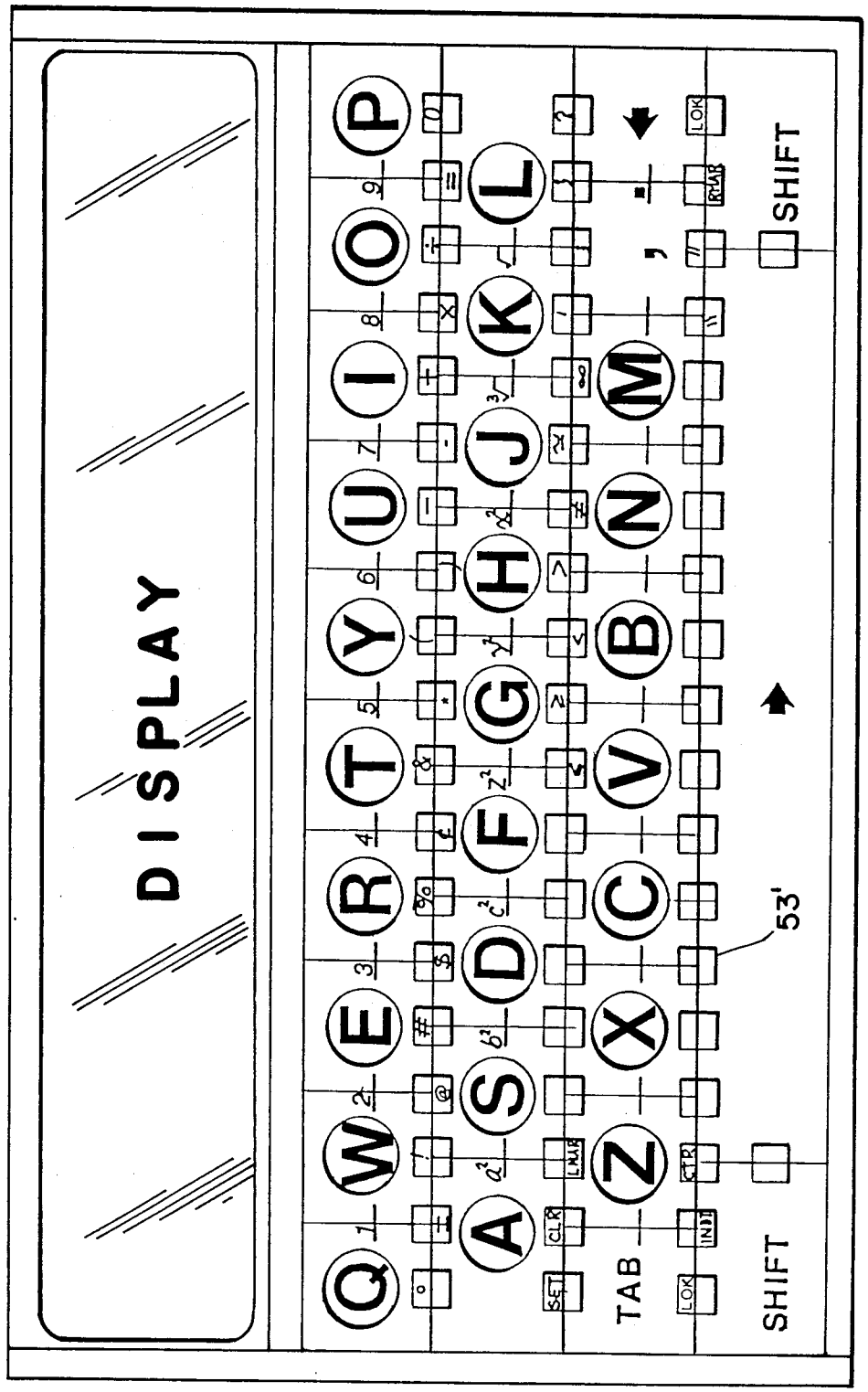

FIGS. 7 and 8 show corresponding layouts for 16 and 17 keys, respectively that are contoured for single hand touch operation. FIG. 9 is a layout adopting a conventional typewriter format which illustrates also the interlacing of key positions in the rows to produce raised finger rest pads 53' for actuation of three keys simultaneously above and below most key positions. Other variations of keyboard configurations may be suggested by this invention.

Having therefore advanced the state of the art, those novel features believed descriptive of the spirit and nature of the invention are defined with particularity in the claims.

I claim:

1. A manual entry data processing system, comprising in combination, a manually actuated keyboard arrangement with a plurality of individual manually movable keyswitches arranged in a single field side-by-side for access by a single hand and for selective actuation by the stroke of a single finger engaging selectively either individual keyswitches or sets of at least two concurrently actuated side-by-side keyswitches bridged by the finger, selection means responsive to the keyswitches actuated for each single finger stroke to derive a set of unique signals numbering substantially in excess of the number of keys, data processing means responsive to said unique signals to enter data words therefrom for processing and to select operating modes from the unique signals for processing the entered data, said data processing means being capable of processing such entered data in a plurality of different modes including a plurality of arithmetic operations, a live keyboard data entry operating mode provided by said data processing means providing for the serial entry of multiple digit words one digit at a time in response to a plurality of successive single finger strokes producing corresponding ones of said unique signals and terminated by a further single finger stroke at a designated keyswitch on the keyboard thereby to enter data word by word into said data processing means, functional control means establishing from the keyboard a variety of different manually selectable ones of said operating modes thereby to direct data processing manipulations on the entered data words in response to further ones of said unique signals, and means for displaying in the vicinity of the keyboard arrangement those operations by which data is processed by said data processing means in response to the functional control means and identity of the keyboard keys to be manually selected for entry of control signals effecting those operations.

2. A system as defined in claim 1 including means for providing direct entry of an entire set of alphanumeric characters in response to said single finger strokes providing said unique signals from said keyboard arrangement consisting of no more than seventeen keyboard switches in said field.

3. A system as defined in claim 1 including contour configurations on said key switches defining a plurality of different contours in separate finger rest regions identifiable by means of touch for distinguishing between finger positions for selecting at least single keyswitch and double keyswitch entries, thereby to aid accurate manual entry of data by the touch method.

4. A system as defined in claim 1 wherein said keyboard arrangement has no more than nine keyboard switches arranged in a row-column matrix layout with said data processing means adapted to enter from these nine switches both decimal digits in sequence to form words in the live keyboard mode, and to respond in a different mode to said functional control means to form a variety of control signals for designating different ones of said arithmetic operations upon the decimal words entered by the keyboard.

5. A system as defined in claim 1 having keys arranged in a conventional typewriter keyboard layout format with key rows interlaced to provide selectable combinations of concurrent signals from three different keyswitches in response to a single finger stroke.

6. A system as defined in claim 1 including one key operable as means for changing in the live keyboard mode the unique signals provided by the set of keys to another set of signals thereby to produce a plurality of at least two different sets of data input for live keyboard entry by a single keystroke per manual data entry cycle from a single set of keys.

7. The system defined in claim 1 wherein the field of keyswitches is laid out in a field for operation by the fingers of a single hand and comprises no more than seventeen keyswitches.

* * * * *